(12) United States Patent
Gaff et al.

(10) Patent No.: US 10,770,363 B2
(45) Date of Patent: *Sep. 8, 2020

(54) POWER SWITCHING SYSTEM FOR ESC WITH ARRAY OF THERMAL CONTROL ELEMENTS

(71) Applicant: Lam Research Corporation, Fremont, CA (US)

(72) Inventors: Keith William Gaff, Fremont, CA (US); Tom Anderson, Hayward, CA (US); Keith Comendant, Fremont, CA (US); Ralph Jan-Pin Lu, Newark, CA (US); Paul Robertson, Fremont, CA (US); Eric A. Pape, Sunnyvale, CA (US); Neil Benjamin, E. Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 107 days.

This patent is subject to a terminal disclaimer.

(21) Appl. No.: 16/056,967

(22) Filed: Aug. 7, 2018

(65) Prior Publication Data
US 2018/0374763 A1     Dec. 27, 2018

Related U.S. Application Data

(63) Continuation of application No. 13/690,745, filed on Nov. 30, 2012, now Pat. No. 10,049,948.

(51) Int. Cl.
*H01L 21/67* (2006.01)
*H01L 21/66* (2006.01)
*H01L 21/683* (2006.01)

(52) U.S. Cl.
CPC ........ *H01L 22/14* (2013.01); *H01L 21/67103* (2013.01); *H01L 21/67109* (2013.01);
(Continued)

(58) Field of Classification Search
CPC ................. H01L 21/3065; H01L 22/10; H01L 21/67109; H01L 21/6831; H01L 21/67103;
(Continued)

(56) References Cited

U.S. PATENT DOCUMENTS

| 3,440,883 A | 4/1969 | Lightner |
| 5,255,520 A | 10/1993 | O'Geary et al. |

(Continued)

FOREIGN PATENT DOCUMENTS

| JP | 601918 | 1/1985 |
| JP | 621176 | 1/1987 |

(Continued)

OTHER PUBLICATIONS

Ayars, Eric "Bandgap in a Semiconductor Diode", Advanced and Intermediate Instructional Labs Workshop, AAPT, Summer Meeting, California State University, Chicago, Jul. 20, 2008 http://phys.csuchico.edu/-eayars/publications/bandgap.pdf.

(Continued)

*Primary Examiner* — Yuechuan Yu

(57) ABSTRACT

A semiconductor substrate support for supporting a semiconductor substrate in a plasma processing chamber includes a heater array comprising thermal control elements operable to tune a spatial temperature profile on the semiconductor substrate, the thermal control elements defining heater zones each of which is powered by two or more power supply lines and two or more power return lines wherein each power supply line is connected to at least two of the heater zones and each power return line is connected to at least two of the heater zones. A power distribution circuit is mated to a baseplate of the substrate support, the power distribution circuit being connected to each power supply line and power return line of the heater array. A (Continued)

switching device is connected to the power distribution circuit to independently provide time-averaged power to each of the heater zones by time divisional multiplexing of a plurality of switches.

20 Claims, 12 Drawing Sheets

(52) U.S. Cl.
CPC .... *H01L 21/67248* (2013.01); *H01L 21/6831* (2013.01); *H01L 2924/0002* (2013.01)
(58) Field of Classification Search
CPC ............... H01L 21/67248; H01L 22/14; H01L 2924/0002; H01L 2924/00
See application file for complete search history.

(56) References Cited

U.S. PATENT DOCUMENTS

| | | |
|---|---|---|
| 5,414,245 A | 5/1995 | Hackleman |
| 5,504,471 A | 4/1996 | Lund |
| 5,515,683 A | 5/1996 | Kessler |
| 5,536,918 A | 7/1996 | Ohkase et al. |
| 5,635,093 A | 6/1997 | Arena et al. |
| 5,665,166 A | 9/1997 | Deguchi et al. |
| 5,667,622 A | 9/1997 | Hasegawa et al. |
| 5,740,016 A | 4/1998 | Dhindsa |
| 5,802,856 A | 9/1998 | Schaper et al. |
| 5,851,298 A | 12/1998 | Ishii |
| 6,060,697 A | 5/2000 | Morita et al. |
| 6,100,506 A | 8/2000 | Colelli, Jr. et al. |
| 6,222,161 B1 | 4/2001 | Shirakawa et al. |
| 6,271,459 B1 | 8/2001 | Yoo |
| 6,353,209 B1 | 3/2002 | Schaper et al. |
| 6,403,403 B1 | 6/2002 | Mayer et al. |
| 6,483,690 B1 | 11/2002 | Nakajima et al. |
| 6,515,207 B1 | 2/2003 | Gregory |
| 6,566,632 B1 | 5/2003 | Katata et al. |
| 6,612,673 B1 | 9/2003 | Giere et al. |
| 6,664,515 B2 | 12/2003 | Natsuhara et al. |
| 6,739,138 B2 | 5/2004 | Saunders et al. |
| 6,740,853 B1 | 5/2004 | Johnson et al. |
| 6,741,446 B2 | 5/2004 | Ennis |
| 6,746,616 B1 | 6/2004 | Fulford et al. |
| 6,795,292 B2 | 9/2004 | Grimard et al. |
| 6,815,365 B2 | 11/2004 | Masuda et al. |
| 6,825,617 B2 | 11/2004 | Kanno et al. |
| 6,847,014 B1 | 1/2005 | Benjamin et al. |
| 6,886,347 B2 | 5/2005 | Hudson et al. |
| 6,921,724 B2 | 7/2005 | Kamp et al. |
| 6,972,524 B1 | 12/2005 | Marakhtanov et al. |
| 6,979,805 B2 | 12/2005 | Arthur et al. |
| 6,985,000 B2 | 1/2006 | Feder et al. |
| 6,989,210 B2 | 1/2006 | Gore |
| 7,075,031 B2 | 7/2006 | Strang et al. |
| 7,141,763 B2 | 11/2006 | Moroz |
| 7,173,222 B2 | 2/2007 | Cox et al. |
| 7,175,714 B2 | 2/2007 | Ootsuka et al. |
| 7,206,184 B2 | 4/2007 | Ennis |
| 7,230,204 B2 | 6/2007 | Mitrovic et al. |
| 7,250,309 B2 | 7/2007 | Mak et al. |
| 7,268,322 B2 | 9/2007 | Kuibira et al. |
| 7,274,004 B2 | 9/2007 | Benjamin et al. |
| 7,275,309 B2 | 10/2007 | Matsuda et al. |
| 7,279,661 B2 | 10/2007 | Okajima et al. |
| 7,297,894 B1 | 11/2007 | Tsukamoto |
| 7,311,782 B2 | 12/2007 | Strang et al. |
| 7,372,001 B2 | 5/2008 | Tachikawa et al. |
| 7,396,431 B2 | 7/2008 | Chen et al. |
| 7,415,312 B2 | 8/2008 | Barnett, Jr. et al. |
| 7,475,551 B2 | 1/2009 | Ghoshal |
| 7,480,129 B2 | 1/2009 | Brown et al. |
| 7,782,583 B2 | 8/2010 | Moon |
| 7,837,826 B2 | 11/2010 | Marakhtanov et al. |
| 7,893,387 B2 | 2/2011 | Ohata |
| 7,940,064 B2 | 5/2011 | Segawa et al. |
| 7,952,049 B2 | 5/2011 | Tsukamoto |
| 7,968,825 B2 | 6/2011 | Jyousaka et al. |
| 8,057,602 B2 | 11/2011 | Koelmel et al. |
| 8,222,574 B2 | 7/2012 | Sorabji et al. |
| 2002/0043528 A1 | 4/2002 | Ito |
| 2002/0076508 A1 | 6/2002 | Chiang et al. |
| 2002/0159216 A1 | 10/2002 | Ennis |
| 2002/0185488 A1 | 12/2002 | Natsuhara et al. |
| 2004/0027781 A1 | 2/2004 | Hanawa et al. |
| 2005/0016465 A1 | 1/2005 | Ramaswamy et al. |
| 2005/0215073 A1 | 9/2005 | Nakamura et al. |
| 2005/0229854 A1 | 10/2005 | Moroz |
| 2006/0065367 A1 | 3/2006 | Chen et al. |
| 2006/0191637 A1 | 8/2006 | Zajac et al. |
| 2006/0226123 A1 | 10/2006 | Birang |
| 2007/0125762 A1 | 6/2007 | Cui et al. |
| 2008/0029195 A1 | 2/2008 | Lu |
| 2008/0049374 A1 | 2/2008 | Morioka et al. |
| 2008/0202924 A1 | 8/2008 | Bluck et al. |
| 2008/0250867 A1 | 10/2008 | Schmalzried et al. |
| 2009/0000738 A1 | 1/2009 | Benjamin |
| 2009/0173445 A1 | 7/2009 | Yeom et al. |
| 2009/0178764 A1 | 7/2009 | Kanno et al. |
| 2009/0183677 A1 | 7/2009 | Tian et al. |
| 2009/0274590 A1 | 11/2009 | Willwerth et al. |
| 2009/0321019 A1 | 12/2009 | Chen et al. |
| 2010/0078424 A1 | 4/2010 | Tsukamoto et al. |
| 2010/0116788 A1 | 5/2010 | Singh et al. |
| 2010/0163546 A1 | 7/2010 | Nanno et al. |
| 2010/0257871 A1 | 10/2010 | Venkatasubramanian et al. |
| 2010/0283565 A1 | 11/2010 | Blakes |
| 2011/0005682 A1 | 1/2011 | Savas et al. |
| 2011/0033175 A1 | 2/2011 | Kasai et al. |
| 2011/0075313 A1 | 3/2011 | Comendant |
| 2011/0092072 A1 | 4/2011 | Singh et al. |
| 2011/0143462 A1 | 6/2011 | Gaff et al. |
| 2012/0033340 A1 | 2/2012 | Roy et al. |
| 2012/0091108 A1 | 4/2012 | Lin et al. |
| 2012/0097661 A1 | 4/2012 | Singh |
| 2012/0115254 A1 | 5/2012 | Singh |
| 2013/0105457 A1 | 5/2013 | Swanson et al. |
| 2013/0161305 A1 | 6/2013 | Ptasienski et al. |

FOREIGN PATENT DOCUMENTS

| | | |
|---|---|---|
| JP | 06010391 B2 | 3/1994 |
| JP | 2004152913 A | 5/2004 |
| JP | 2004241302 A | 8/2004 |
| JP | 2005123286 A | 5/2005 |
| JP | 2005294237 A | 10/2005 |
| JP | 2007081160 A | 3/2007 |
| JP | 2007082374 A | 3/2007 |
| JP | 2009267256 A | 11/2009 |
| JP | 2010153730 A | 7/2010 |
| KR | 20050121913 A | 12/2005 |
| KR | 20060067552 A | 6/2006 |
| KR | 20080058109 A | 6/2008 |

OTHER PUBLICATIONS

Chinese Office Action for Chinese Application No. 201310628285.9 dated Oct. 31, 2016.
Commonly-Owned Utility U.S Appl. No. 13/234,473, filed Sep. 16, 2011.
Commonly-Owned Utility U.S Appl. No. 13/237,444, filed Sep. 20, 2011.
Commonly-Owned Utility U.S Appl. No. 13/238,396, filed Sep. 21, 2011.
International Search Report and Opinion dated Jul. 28, 2011 for PCT/US2010/002794.
Office Action (Notification of the Final Office Action) dated Apr. 26, 2016, by the Korean Patent Office in corresponding Korean Patent Applicaiton No. 10-2013-7012033, and a Partial English Translation of the Office Action (5 pages).

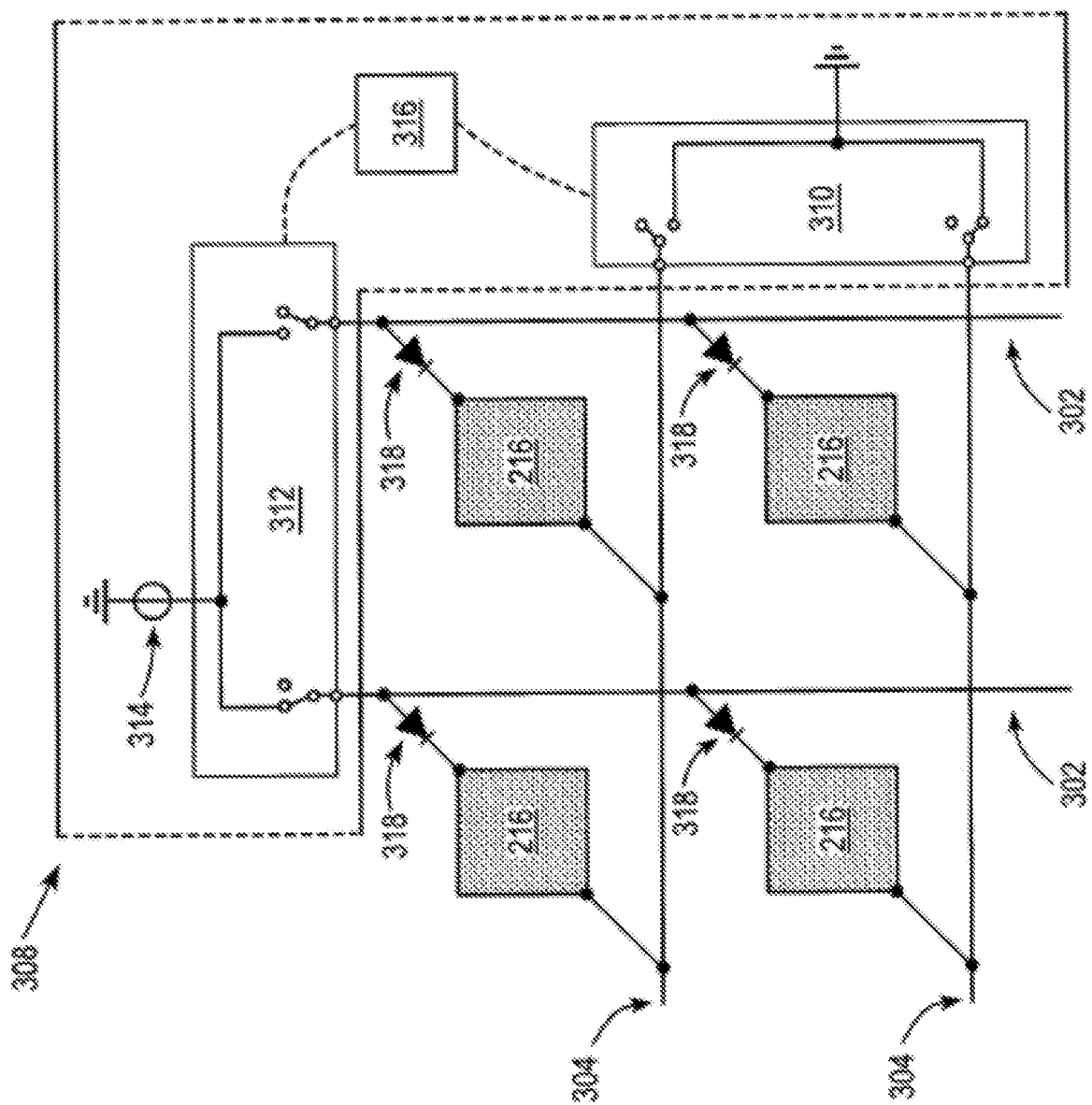

POWER SWITCHING SYSTEM FOR ESC WITH ARRAY OF THERMAL CONTROL ELEMENTS

CROSS-REFERENCE TO RELATED APPLICATIONS

The present disclosure is a continuation of U.S. patent application Ser. No. 13/690,745 filed on Nov. 30, 2012. The entire disclosure of the application referenced above is incorporated herein by reference.

FIELD

The present disclosure relates to plasma processing chambers, such as, a plasma etching chamber having a substrate support assembly with an array of thermal control elements achieving a spatial temperature profile on a semiconductor substrate distribution during plasma processing.

BACKGROUND

Critical dimension (CD) control is a challenge during semiconductor substrate manufacturing steps such as plasma etching. The uniformity of CD across the substrate can also affect the yield of chips from the substrate. In known semiconductor manufacturing nodes, a CD uniformity of <1 nm can be specified.

Controlling temperature is not an easy task for several reasons. First, many factors can affect heat transfer, such as the locations of heat sources and heat sinks, and the movement, materials and shapes of the media. Second, heat transfer is a dynamic process. Unless the system in question is in heat equilibrium, heat transfer can occur and the temperature profile and heat transfer will change with time. Third, non-equilibrium phenomena, such as plasma, which of course is always present in plasma processing, make the theoretical prediction of heat transfer behavior of any practical plasma processing apparatus very difficult if not impossible.

The substrate temperature profile in a plasma processing apparatus is affected by many factors, such as the plasma density profile, the radio frequency (RF) power profile and the detailed structure of the various heating and cooling elements in the electrostatic chuck assembly, hence the substrate temperature profile is often not uniform and difficult to control with a small number of heating or cooling elements. This deficiency translates to non-uniformity in the processing rate across the whole substrate and non-uniformity in the critical dimension of the device dies on the substrate.

In known plasma processing systems, control electronics for the electrostatic chuck system having one or more thermal control elements such as heaters or peltier devices, can be sensitive to RF noise. As a result, the control electronics are isolated from the active RF of the plasma processing by being located outside of the processing chamber. That is, in known systems the control electronics for the substrate support assembly are located on a high voltage side of an RF filter at a position that is outside the plasma processing chamber. The electrostatic chuck control electronics, on the other hand, are on the low RF voltage side of the RF filter. This arrangement is known to reduce the RF voltage on the ESC heater power lines to levels that do not interfere with the control electronics. When the number of power lines is small (e.g., less than 8-10 power lines), such as for a substrate support assembly having a single temperature control element, the RF filter can be of relatively small size and expense. However, for an electrostatic chuck system having multiple thermal control elements, the number of power lines between the switching control electronics and the electrostatic chuck assembly can be much greater than 8-10 lines (e.g., 16 or 28 pairs of wires), and the RF filter can become prohibitively bulky and expensive. The size, cost, and complexity in RF filtering for electrostatic chuck systems present limitations and problems in the design of electrostatic chuck systems and plasma processing chambers with very tight control on process uniformity (e.g. <1 nm variation in CD).

SUMMARY

According to one embodiment, a semiconductor substrate support for supporting a semiconductor substrate in a plasma processing chamber includes an array of heaters operable to tune a spatial temperature profile on the semiconductor substrate, the heaters powered by two or more power supply lines and two or more power return lines wherein each power supply line is connected to at least two of the heaters and each power return line is connected to at least two of the heaters, a power distribution circuit mated to a baseplate of the substrate support, the power distribution circuit including wiring connected to each power supply and power return line of the heater array; and a switching device connected to the power distribution circuit to independently supply power to each one of the heaters via one of the power supply lines and one of the power return lines so as to provide time-averaged power to each of the heaters by time divisional multiplexing of a plurality of switches.

According to another embodiment, a method of plasma etching a semiconductor substrate such as a wafer in a plasma processing chamber including the forgoing substrate support includes independently supplying power to each one of the thermal control elements via one of the power supply lines and one of the power return lines to provide time-averaged power to each of the thermal control elements by time-divisional multiplexing of a plurality of switches of the power switching device.

BRIEF DESCRIPTION OF THE DRAWINGS

In the following, the disclosure will be described in greater detail by means of exemplary embodiments and with reference to the attached drawings:

FIG. 8B illustrates a timing circuit for controlling the auxiliary heating layer in accordance with an exemplary embodiment of the present disclosure.

DETAILED DESCRIPTION

Considering the complex nature of temperature control on the surface of a substrate support assembly in a plasma processing chamber, it would be advantageous to incorporate multiple independently controllable planar thermal control elements in the substrate support assembly to enable the apparatus to actively create and maintain the desired spatial and temporal temperature profile, and to compensate for other adverse factors that affect CD uniformity, e.g., non-uniformity caused by upstream or downstream processes. Moreover, the size, complexity, and number of RF filtering components can be reduced by arranging the power distribution, control, and switching electronics on a low voltage side of the RF filtering components, e.g., at a location inside the plasma processing chamber.

Figure 1:
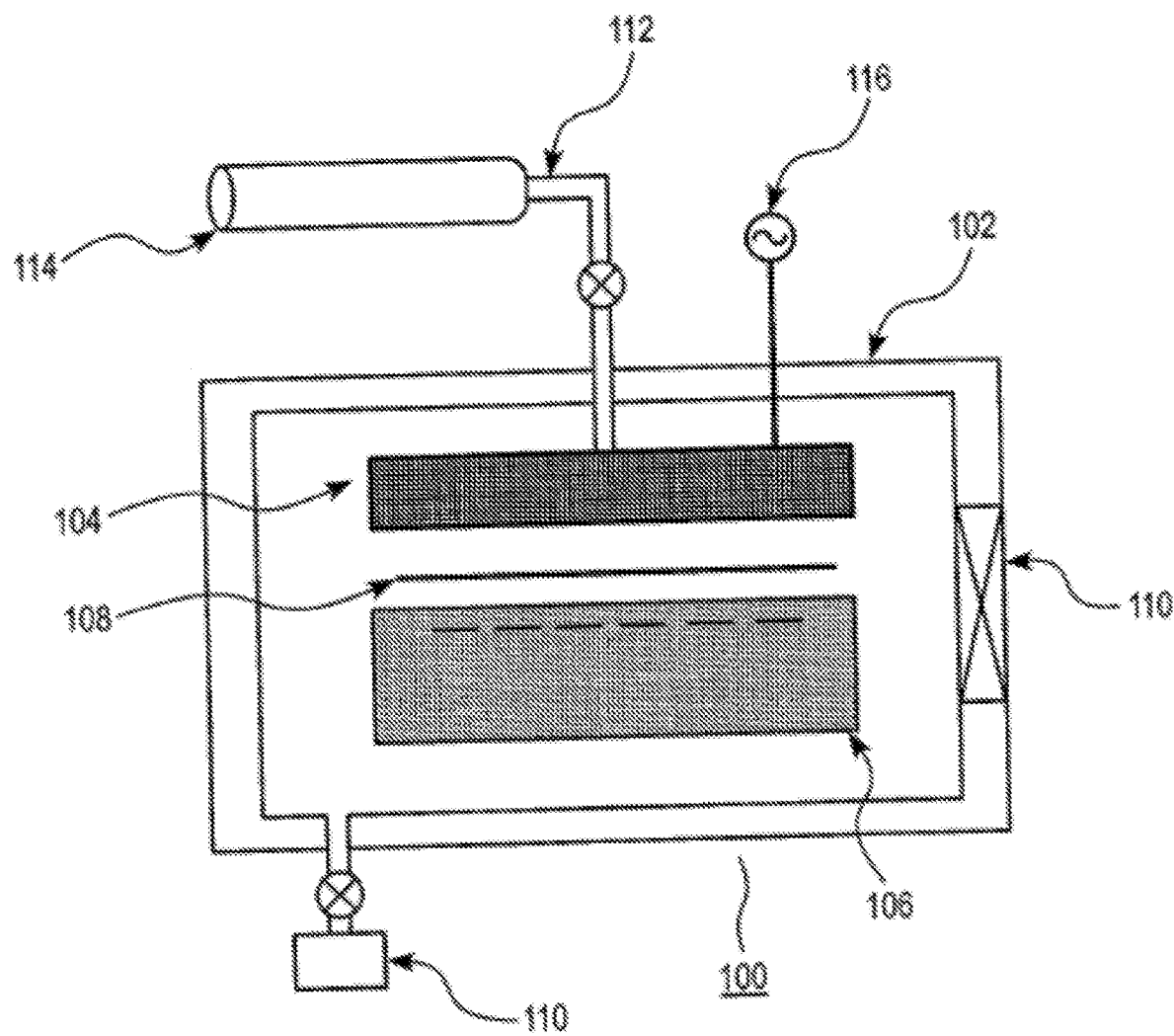
FIG. 1 illustrates a schematic overview of a plasma processing system in accordance with an exemplary embodiment of the present disclosure.

FIG. 1 illustrates a schematic overview of a plasma processing apparatus in accordance with an exemplary embodiment of the present disclosure. As shown in FIG. 1, the plasma processing apparatus 100 includes a chamber 102 having an upper showerhead electrode 104 and a substrate support assembly 106 which includes a lower electrode. A substrate 108 such as a wafer can be loaded through a loading port 110 onto the substrate support assembly 106. A gas line 112 supplies process gas to the upper showerhead electrode 104 and the showerhead electrode delivers process gas into the chamber 102. A gas source 114 (e.g., a mass flow controller power supplying a suitable gas mixture) is connected to the gas line 112. A radio frequency (RF) power source 116 is connected to the upper showerhead electrode 104. A vacuum pump 118 can be used to evacuate the chamber 102, so that the RF power is capacitively coupled between the upper showerhead electrode 104 and the lower electrode (not shown) in the substrate support assembly 106 to energize the process gas into plasma in the space between the substrate 108 and the upper showerhead electrode 104. The plasma can be used to etch device die features into layers on the substrate 108.

It should be appreciated that while the detailed design of the plasma processing apparatus 100 may vary, in exemplary embodiments RF power is coupled through the substrate support assembly 106. While a capacitively coupled plasma chamber is shown, the plasma processing apparatus can rely on other mechanisms to generate plasma, such as inductive coupling (transformer coupling), helicon, electron cyclotron resonance, or the like. For instance, high density plasma can be produced in a transformer coupled plasma (TCP™) processing chamber, or in an electron cyclotron resonance (ECR) processing chamber. For example, in a transformer coupled plasma processing chamber, RF energy is inductively coupled through a dielectric window into the chamber. In addition, a plasma processing apparatus 100 can be configured with a high-density plasma source, such as an inductively coupled plasma (ICP) source, in conjunction with a radio frequency (RF) biased substrate electrode. A plasma processing apparatus in the context of exemplary embodiments of the present disclosure is not limited to the above-described examples, and can be any of a number of suitable implementations as desired.

Figure 2:
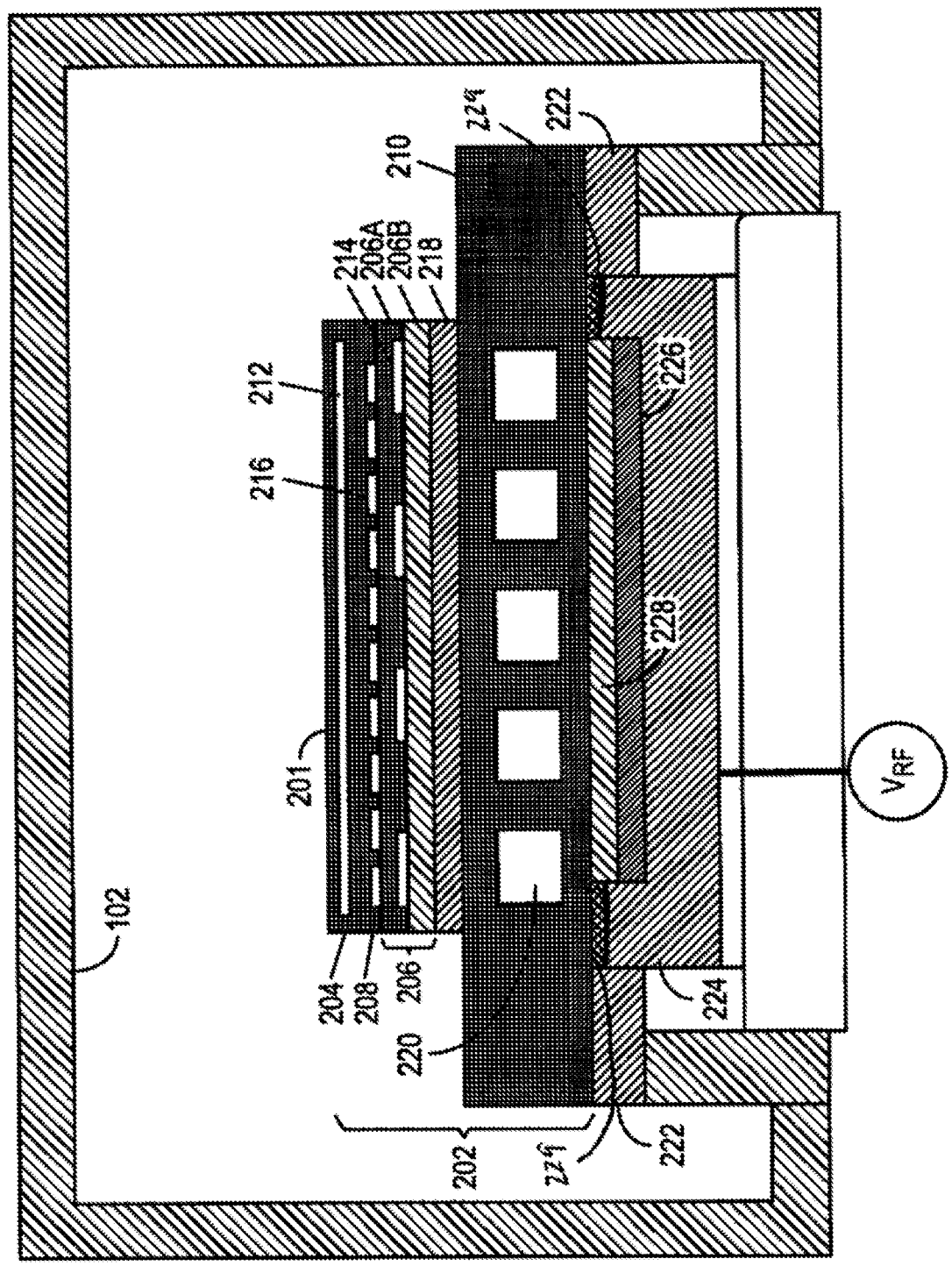
FIG. 2 illustrates a schematic diagram of a first arrangement of an electrostatic chuck assembly and control electronics in accordance with an exemplary embodiment of the present disclosure.

FIG. 2 illustrates a schematic overview of a first arrangement of a substrate support assembly 200 and control electronics in accordance with an exemplary embodiment of the present disclosure.

The substrate support assembly 200 can be configured for a variety of functions during plasma processing, such as supporting the substrate, tuning the substrate temperature, and supplying radio frequency power. To achieve these functions, the substrate support assembly can include an electrostatic chuck (ESC) assembly 202. The ESC assembly 202 can include a ceramic layer 204, a primary heating plate 206, an auxiliary heating layer 208, and a cooling plate (e.g., baseplate) 210. The ceramic layer 204 includes one or more clamping electrodes (e.g., monopolar or bipolar) 212 for electrostatically clamping a substrate onto the substrate support assembly 200 during processing. The ESC ceramic layer 204 is located above the primary heating plate 206. In an exemplary embodiment, the ESC ceramic layer 204 can be bonded to the auxiliary heating layer 208, which is bonded to the primary heating plate 206. When DC voltage is applied to the clamping electrode 212, an electrostatic clamping force is established and adheres the substrate 108 to the substrate support surface 201 of the ESC ceramic layer 204.

The primary heating plate 206 can include one or more primary heaters 214 incorporated in a laminate of two electrically insulating layers 206A and 206B or be attached to a metal plate (not shown). The electrically insulating layers 206A, 206B can be formed of a polymer material, an inorganic material, a ceramic such as silicon oxide, alumina, yttria, aluminum nitride or any other suitable insulating material as desired. When connected to DC power, the one or more primary heaters 214 generate a substantial portion of heat to achieve a desired surface temperature profile of the substrate support surface 201. The primary heating plate 206 can be above or below the auxiliary heating layer 208.

The auxiliary heating layer 208 can be ceramic or polymer layer(s) and can include multiple independently controlled thermal control elements 216 embedded therein. Fine tuning of the surface temperature profile established by the primary heating plate 206 can be provided by the thermal control elements 216, which through suitable selection and timing can reduce temperature differences across the substrate support surface 201. The thermal control elements 216 can include an array of heaters operable to tune a spatial temperature profile on the semiconductor substrate support surface. In an exemplary embodiment, the heater array can include at least 49 local temperature elements, such as film heaters, diodes, thermo-electronic (Peltier) elements, and resistance heaters arranged in any suitable geometric array or pattern. It should be understood that in exemplary embodiments, the heater array can include a single type of local temperature element or any combination of local temperature element types as desired. For example, the heater array can include a mixture of local temperature elements in a range of 5% heating elements and 95% cooling elements to 95% heating elements and 5% cooling elements, or any other suitable combination of temperature elements to achieve the desired spatial temperature profile.

In a preferred embodiment, the auxiliary heating layer 208 is located between the ceramic ESC layer 204 and the primary heating plate 206. In this arrangement, the primary heating plate 206 is formed on a surface of a thermal barrier layer 218, which is disposed on the cooling plate 210.

The cooling plate 210 has a plurality of channels 220 for coolant flow. The cooling plate 210 also forms the baseplate of the ESC assembly 202. The cooling plate 210 can be attached to the chamber via a ceramic insulator ring 222. Attachment of the cooling plate 210 to the ceramic insulator ring 222 can be realized through screws, or any other suitable attaching means as desired.

Figure 3:
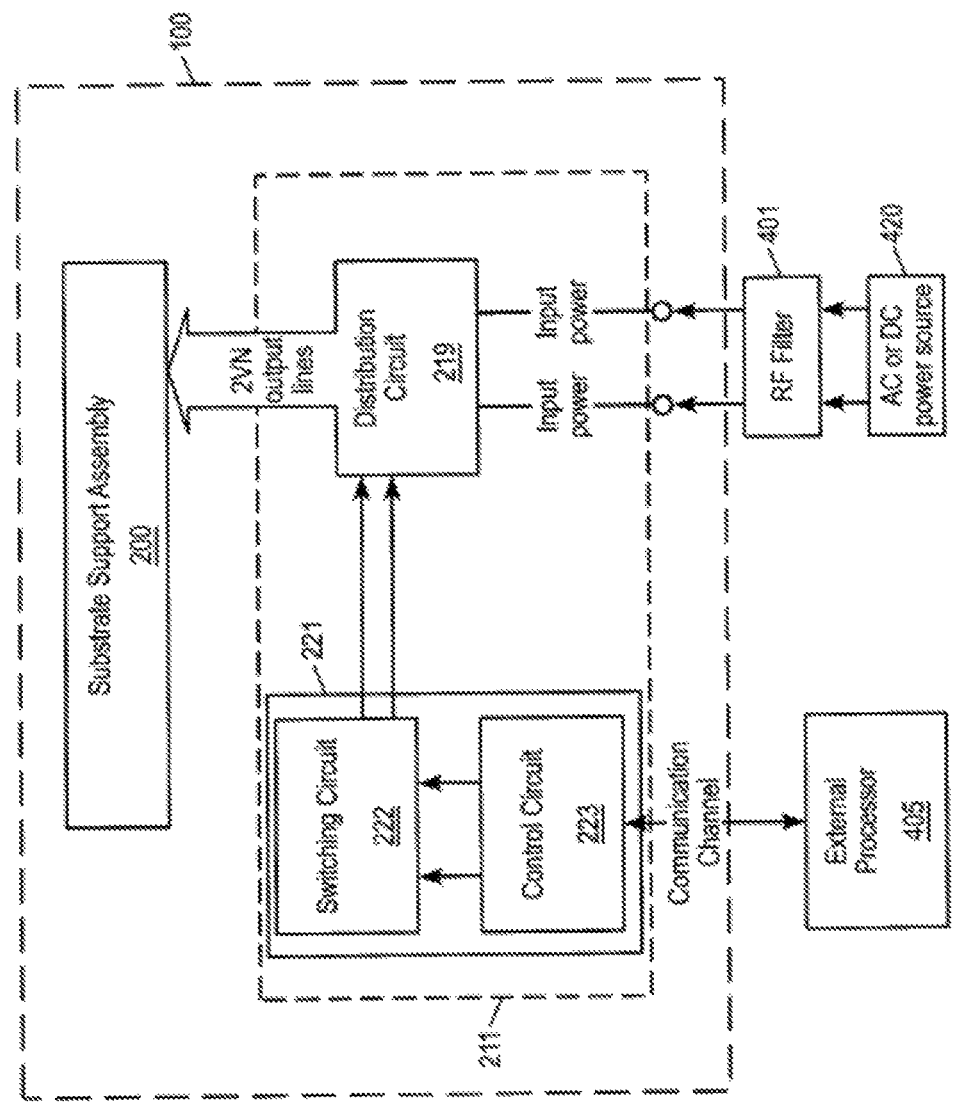
FIG. 3 illustrates a schematic diagram of a power distribution assembly in accordance with an exemplary embodiment of the present disclosure.

FIG. 3 illustrates a schematic diagram of a power distribution assembly in accordance with an exemplary embodiment of the present disclosure. The power distribution assembly 211 can be electrically connected to the cooling plate 210 inside the plasma processing chamber to distribute AC, DC, and/or RF power to the support assembly 200 during plasma processing. The power distribution assembly 211 includes a power distribution circuit 219 configured to supply at least one of AC and DC power to the support assembly 200, and a facilities plate 224 electrically connected to the power distribution circuit 219 and configured such that when the facilities plate 224 is mated (e.g., attached, electrically connected) with the cooling plate 210 of the support assembly 200 and RF power is supplied to the facilities plate 224, the power distribution circuit 219 is at an RF potential shared by the facilities plate 224 and the cooling plate 210.

As shown in FIG. 2, the cooling plate 210 is disposed on the facilities plate 224, which provides coolant fluid, gas, and electrical power to the electrostatic chuck assembly. The cooling plate 210 can be attached (e.g., electrically connected) to the facilities plate 224 via screws or other suitable attaching means as desired. In the exemplary embodiments described herein, the coolant plate of the electrostatic chuck assembly and facilities plate are made of electrically conducting material, such as metal, or coated with an electrically conducting material. An RF gasket (not shown), which is electrically conductive, can be disposed between an outer edge of the cooling plate 210 and the facilities plate 224 to establish an electrical connection therebetween. The facilities plate 224 is connected to an RF power source VRF and provides RF power to the cooling plate 210. In another exemplary embodiment, the facilities plate 224 can include insulated and/or shielded connections and conduits that provide RF power and/or other specified facilities (e.g., helium, coolant, or other suitable supply as desired) to the ESC assembly 202. All DC and AC power for the electrostatic chuck assembly can be fed through the facilities plate 224 via a single cable (not shown). Any combination and number of RF filters, as desired, can be disposed between AC or DC power supplies that are located outside the plasma processing chamber and the facilities plate 224. In an exemplary embodiment in which an AC power supply is connected to feed electrical power to the facilities plate 224, one or more AC-to-DC converters can be used to convert the power signal from the AC power supply to a DC power signal prior to the signal being fed to the facilities plate 224.

The power distribution circuit 219 is formed on a first circuit board, e.g., a distribution board 228, configured to be mated to the cooling plate 210 of the support assembly 200 in an enclosed volume 234 between the cooling plate 210 and the facilities plate 224. The distribution board 228 can be attached to a bottom surface of the cooling plate 210 via bonding, such as a layer of adhesive, or by mechanical means such as screws (not shown) or other suitable bonding means as desired. The cooling plate 210 and facilities plate 224 act as an RF shield (e.g., electrostatic shield) when they are made of electrically conducting material or coated with an electrically conducting material so that the RF current travels along outer surfaces of the facilities plate 224 and the cooling plate 210 and around the enclosed volume 234 rather than through the distribution board and control electronics. In this arrangement, the distribution board 228 is shielded from RF noise (e.g., interference). In the context of exemplary embodiments of the present disclosure, RF noise can be any unwanted or spurious RF signal whether it has a random power spectrum or unwanted coupling of specific frequencies generated by the RF sources in the system such as the bias generators connected to the electrostatic chuck assembly 202. According to exemplary embodiments of the present disclosure, the RF shield is a closed conductor shield (e.g., cooling plate 210 and facilities plate 224) containing a finite number of connector penetrations, each connector penetration being decoupled from RF common using bypass capacitors. The bypass connectors are located between the electrical connections and the RF shield and are outside the enclosed volume 234.

The distribution board 228 can include multiple layers where one layer is a common voltage plane (e.g., common conductive plane) for the electronics connected to the facilities plate 224 so that the voltage on the common plane is at the same electrical potential as the facilities plate 224 and the cooling plate 210 so as to reduce the likelihood of arcing from the facilities plate or cooling plate 210 to the components or circuits on the distribution board 228 when RF power is supplied to the cooling plate 210. The distribution board 228 includes at least two terminals 213 to connect input power lines 215 of the power distribution circuit 219 to an AC or DC power supply. The distribution board 228 also includes at least $2\sqrt{N}$ output power lines to connect the input power lines 215 of the power distribution circuit 219 to the thermal control elements 216 of the thermal array in the electrostatic chuck assembly 202, where N equals a number of thermal control elements 216. The distribution board 228 can also include traces that route electrical current from the pads to wires passing through the cooling plate 210. The distribution board 228 can include filtering elements, such as capacitors connected between one or more of the input power lines and the facilities plate 224, from the output power lines to the facilities plate, and/or between the common voltage plane and the cooling plate 210 and/or facilities plate 224, to shunt RF current flowing through the facilities plate thus prevent RF current flowing through the components of the distribution board 228. In an exemplary embodiment, the distribution board 228 can include memory for storing calibration data or identification numbers for the ESC assembly 202.

In another exemplary embodiment, the facilities plate 224 can be formed from a non-conductive, dielectric and/or mesh material. In such case, the common voltage plane of the distribution board 228 can form a shielded enclosure for the distribution board 228 by being attached (e.g., electrically connected) to the cooling plate 210. It should be understood that in this exemplary embodiment the common voltage plane is a metal plate or metal form such that when attached to the cooling plate 210 establishes a Faraday shield such that no active RF in the plasma processing chamber enters the enclosure.

As shown in FIG. 3, the power distribution assembly 211 also includes a power switching device 221. The power switching device 221 includes a switching circuit 222 and a control circuit 223. The switching circuit 222 of the switching device 221 is connected to the power distribution circuit 219 to independently supply power to each one of the thermal control elements 216 via one of the power supply lines and one of the power return lines to provide time-averaged power to each of the thermal control elements 216 by time divisional multiplexing of a plurality of switches by addressably connecting one or more thermal control elements 216 of the thermal array of the substrate support assembly 200 to AC or DC power. The control circuit 223 communicates with an external device, such as a processor or computer outside of the plasma processing chamber, for command and control of the power distribution and switching circuits. In an exemplary embodiment, the switching and control circuits 222, 223 can be formed on the distribution circuit board 228 of the power distribution assembly 211. In another exemplary embodiment, the switching and control circuits 222, 223 can be formed on a second circuit board, e.g., a switching electronics board 226, which can be mated to the distribution board 228 of the power distribution circuit 219.

The switching electronics board 226 is a printed circuit board (PCB) that includes circuitry for addressably supplying switched power to the array of thermal control elements 216 of the auxiliary heating layer 208. The switching electronics board 226 can be disposed in the enclosed volume 234 between the facilities plate 224 and the cooling plate 210 in a location between the distribution circuit board 228 and the facilities plate 224. The switching electronics board 226 includes a common voltage plane 227 for the electronics which is electrically connected to the facilities plate 224 so that the voltage on the common plane 227 is at the same electrical potential as the facilities plate 224 to reduce the likelihood of arcing between the facilities plate 224 and components or circuits on the switching electronics board 226. The switching electronics board 226 can also include capacitors connected between one or more of the input power lines and the facilities plate 224, from the output power lines to the facilities plate 224, and between the common voltage plane 227 and the facilities plate 224 to shunt RF current flowing through the facilities plate 224, thereby preventing RF current flowing through the switching and control circuits of the switching electronics board 226. In another exemplary embodiment, the switching electronics board 226 can be attached to an upper surface of the facilities plate 224. For example, the switching electronics board 226 can be mated to a lower surface of the distribution board 228 so that the switching electronics board 226 is within the enclosed volume 234 between the distribution board 228 and an upper surface of the facilities plate 224.

RF power received from an RF source VRF by the facilities plate 224 is provided to the ESC assembly 202 via an electrical connection to the cooling plate 210. As already discussed, an RF gasket can be disposed between the facilities plate 224 and the cooling plate 210, and provide an interface that establishes the electrical connection between the two components. It should be understood that the ESC assembly 202 may incorporate features of the tunable ESC (T-ESC). Assemblies described in commonly assigned U.S. Pat. Nos. 6,847,014 and 6,921,724, which are hereby incorporated by reference.

The distribution board 228 can include pads that provide electrical contact with pins on the switching electronics board 226. The distribution board 228 can also include traces that route electrical current from the pads to wires passing through the cooling plate 210. In another exemplary embodiment, sockets are located on each input line of the distribution board 228 and mate with the pins located on the switching electronics board 226. The distribution board 228 can include memory for storing calibration data or identification numbers for the ESC assembly 202. With this configuration, the switching electronics board 226 has read/write access to the memory of the distribution board 228.

In another exemplary embodiment, the switching electronics board 226 includes sockets on each output line that mate with pins on the distribution board 228, which is attached to the cooling plate 210, so that an electrical connection can be established. In an exemplary embodiment, the switching electronics board 226 includes pads on each output line that contact pins on the distribution board 228 of the cooling plate 210 to establish an electrical connection.

Figure 4:
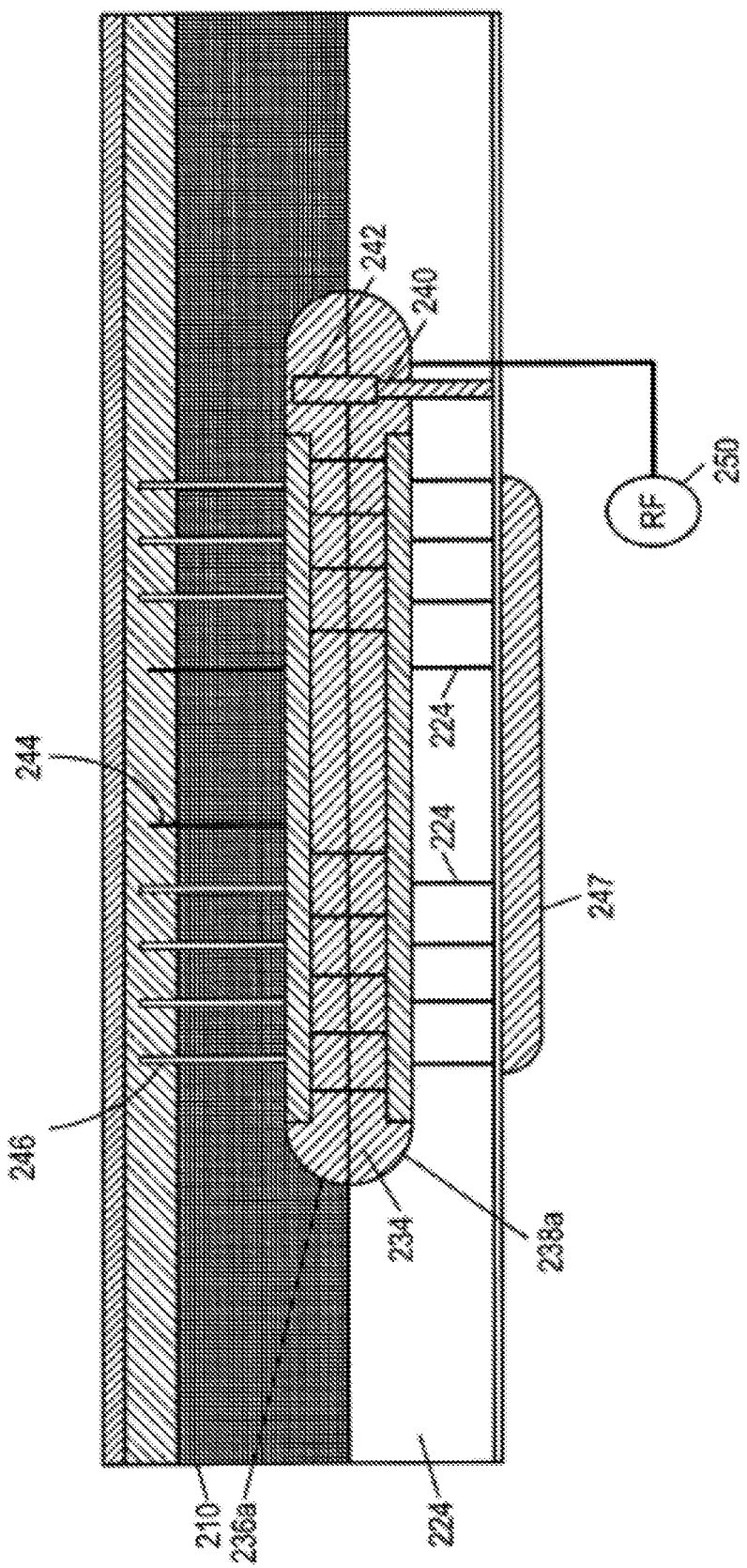
FIG. 4 illustrates a cut-away view of the first arrangement of an electrostatic chuck assembly and control electronics in accordance with an exemplary embodiment of the present disclosure.

FIG. 4 illustrates a cut-away view of the first arrangement of an electronic chuck assembly and control electronics in accordance with an exemplary embodiment of the present disclosure As shown in FIG. 4, the distribution board 228 and the switching electronics board 226 are disposed in the enclosed volume 234 between the facilities plate 224 and the cooling plate 210. The enclosed volume 234 is formed through an alignment of a recess 236 in the bottom surface of the cooling plate 210 and a recess 238 in the top surface of the facilities plate 224. The outer surfaces (e.g. edges) 236a, 238a of the cooling plate 210, and the facilities plate 228, respectively forming sidewalls of the enclosed volume 234. An alignment pin 240 is used to align the cooling plate 210 and the facilities plate 224 during assembly. The alignment pin 240 extends from the facilities plate 224 and mates with a receptacle 242 extending from the cooling plate 210. Power is supplied to the primary heating plate 206 through supply line 244, and to the auxiliary heating layer 208 through supply lines 246. RF power can be supplied to the facilities plate 224 through RF supply 250.

Each of the supply lines 244 and 246 extends through (e.g., penetrates) the cooling plate with the supply lines 244 terminating at the primary heating plate 206 and the distribution board 228 and the supply lines 246 terminating at the auxiliary heating layer 208 and the distribution board 228.

As already discussed, the distribution board 228 is attached to a bottom surface of the cooling plate 210 within the enclosed volume 234. The switching electronics board 226 is attached to a top surface of the facilities plate 224 within the enclosed volume 234. The distribution board 228 and the switching electronics board 226 are electrically connected so that the switching device 221 of the switching electronics board 226 can supply power to each one of the via one of the power supply lines and one of the power return lines so as to provide time-averaged power to each of the by time divisional multiplexing of a plurality of switches.

The switching electronics board 226 includes transistors on at least one of its surfaces. Each transistor corresponds to one of the plurality of switches of the switching circuit 222, and can include metal oxide field effect transistors (MOSFET), power switching FETs, or any other suitable transistor as desired. In an exemplary embodiment, the switching devices can be MOSFETs that extend from the surface of the switching electronics board 226 through a top surface of the facilities plate 224 to a bottom surface of the facilities plate 224, which acts as a heat sink to cool the transistors. The facilities plate 224 includes a plurality of holes that extend from the first surface to the second surface and each hole is configured to receive one of the MOSFETs. A sealing member 247, such as at least one sealing cap, can be attached to the bottom surface of the facilities plate 224 and at a location where the plurality of vertical MOSFETs terminate. The sealing member 247 provides a barrier and enclosure that protects the MOSFETs from RF.

Figure 5:
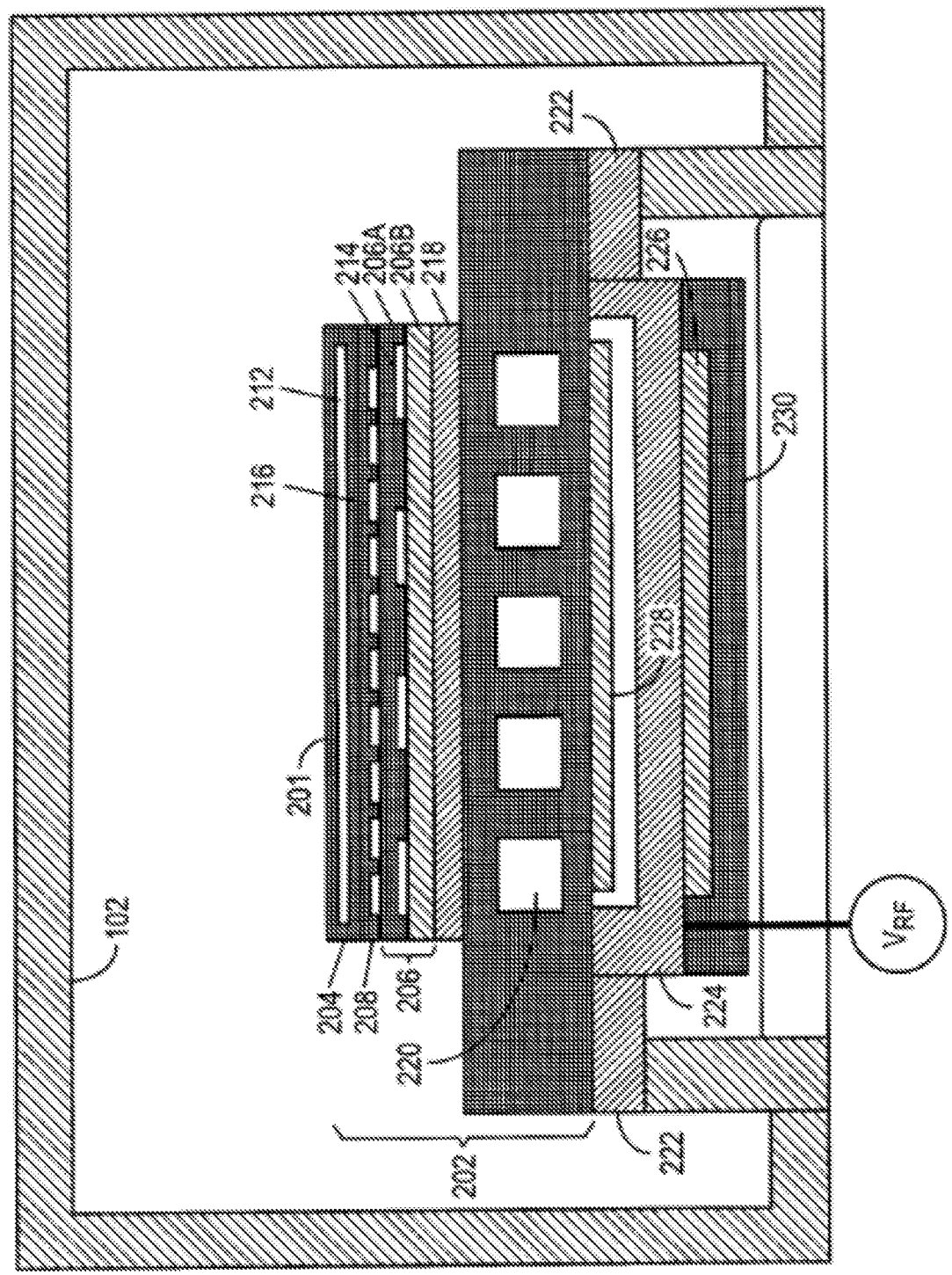
FIG. 5 illustrates a schematic diagram of a second arrangement of an electrostatic chuck assembly and control electronics in accordance with an exemplary embodiment of the present disclosure.

FIG. 5 illustrates a schematic overview of a second arrangement of an electrostatic chuck assembly and control electronics in accordance with an exemplary embodiment of the present disclosure. In the context of the present disclosure, the same element numbers are used to designate common features among the drawing figures. The exemplary arrangement shown in FIG. 5 has substantially the same ESC assembly 202 configuration as illustrated in FIG. 2. Regarding the control electronics, however, the switching electronics board 226 is formed on a lower surface of the facilities plate 224. A metal cage 230 can be formed over the switching electronics board 226 to enclose the switching electronics board 226 within a volume between the metal cage 230 and the facilities plate 224. The switching electronics board 226 is electrically connected to the facilities plate 224, which is metal or metal coated, such that the enclosed volume 234 establishes a Faraday cage that protects the board electronics from RF noise. For example, as already discussed the switching electronics board 226 can be a multilayer board having a common voltage plane 227 connected to the facilities plate 224. The metal cage 230 can be attached (e.g., electrically connected) to the outside surface of the facilities plate 224 via screws or other suitable attaching means, so that the switching electronics board 226 is fully enclosed within the metal cage 230.

Figure 6:
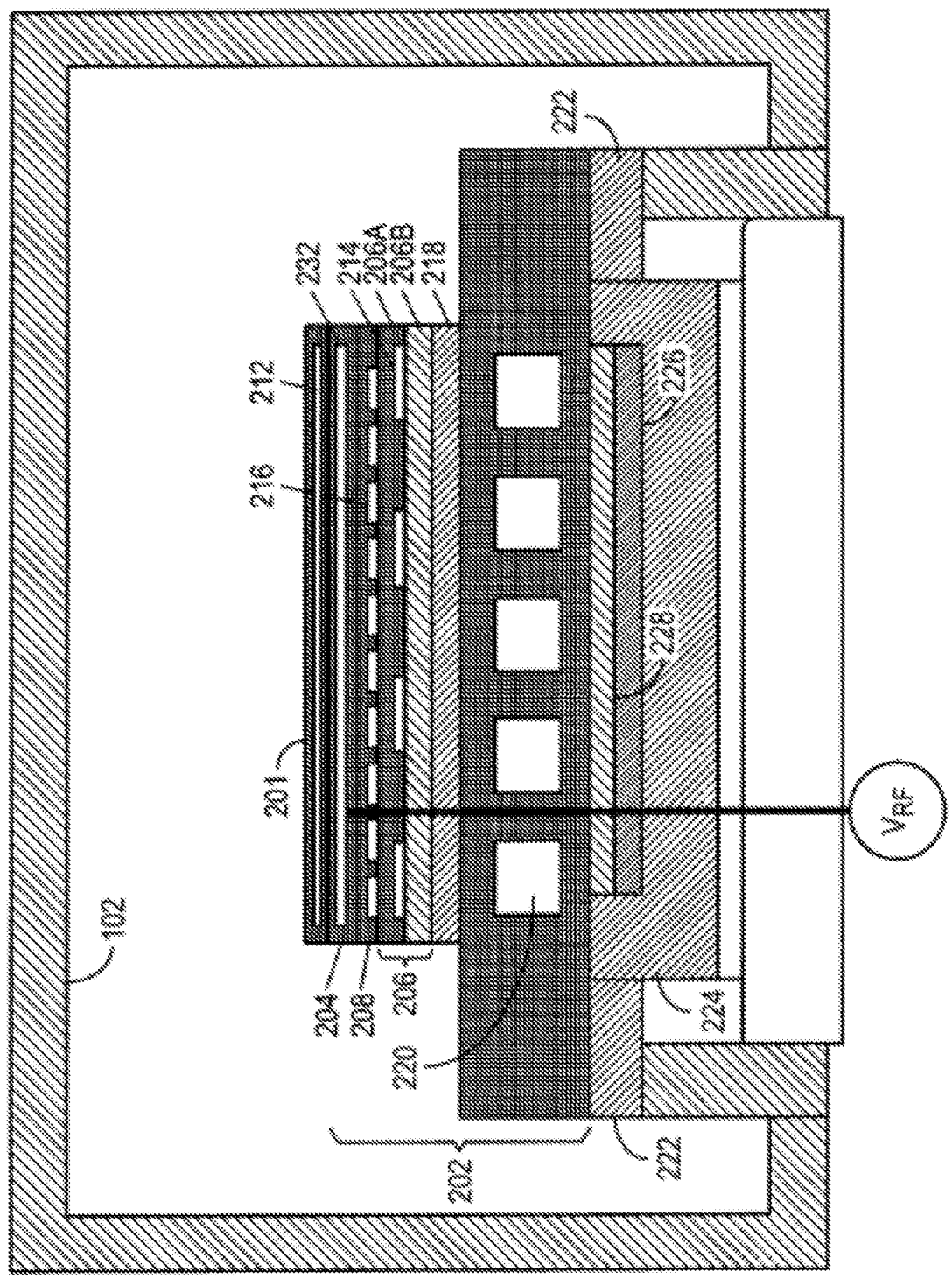
FIG. 6 illustrates a schematic diagram of a third arrangement of an electrostatic chuck assembly and control electronics in accordance with an exemplary embodiment of the present disclosure.

FIG. 6 illustrates a schematic overview of a third arrangement of an electrostatic chuck assembly and control electronics in accordance with an exemplary embodiment of the present disclosure.

As shown in FIG. 6, the ceramic layer 204 of the ESC assembly 202 includes the clamping electrode 212 and an RF electrode 232. In this exemplary embodiment, the RF source is connected to the RF electrode 232. This arrangement is advantageous in that it reduces the amount of RF coupled to the primary heating plate 206 and the auxiliary heating layer 208.

Figure 7:
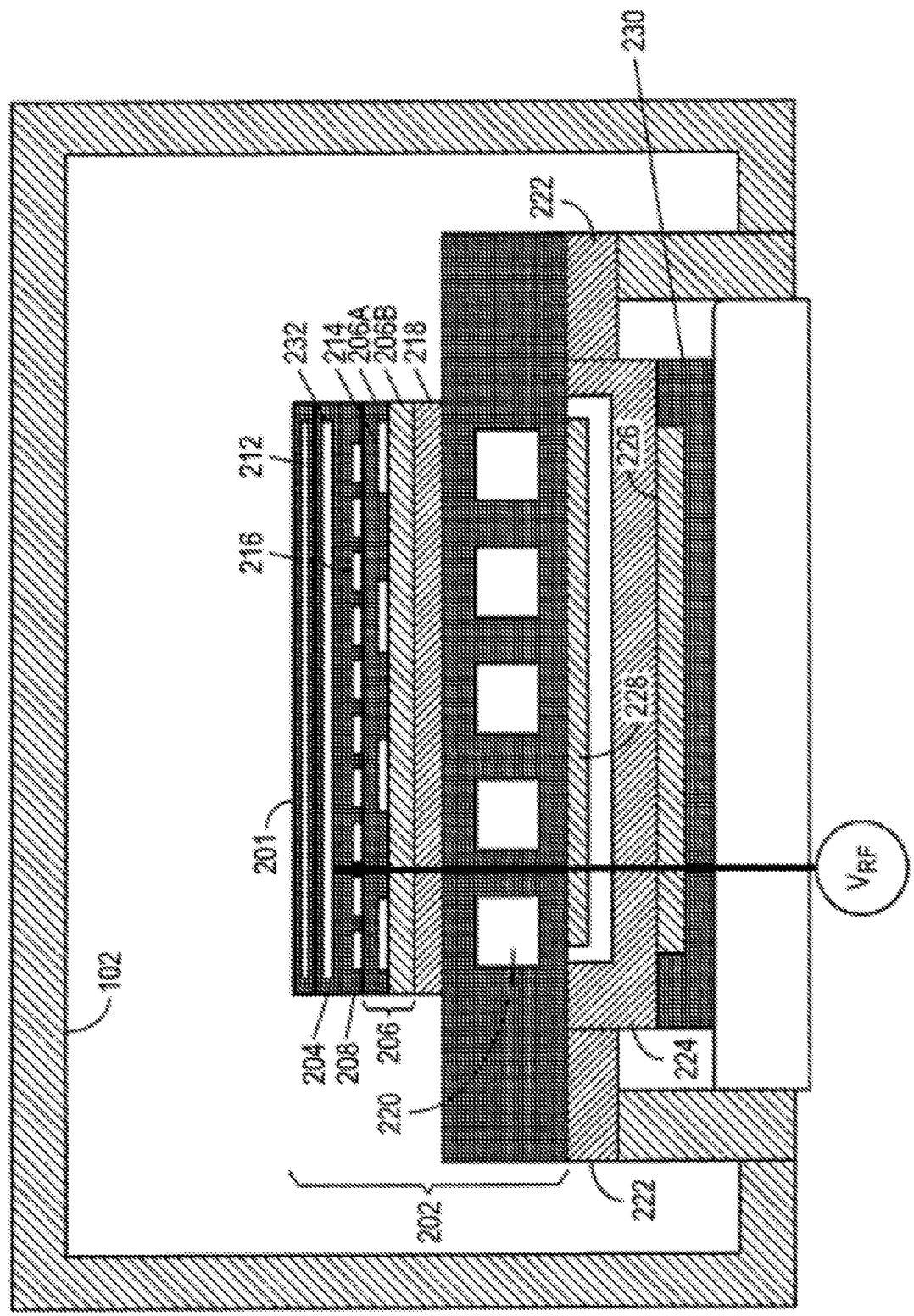
FIG. 7 illustrates a schematic diagram of a fourth arrangement of an electrostatic chuck assembly and control electronics in accordance with an exemplary embodiment of the present disclosure.

FIG. 7 illustrates a schematic overview of a fourth arrangement of an electrostatic chuck assembly and control electronics in accordance with an exemplary embodiment of the present disclosure. FIG. 7 shows another exemplary embodiment of the arrangement of FIG. 5, where the exemplary arrangement of FIG. 6 includes the RF electrode 232 in the ceramic layer 204, and the RF source providing RF power to the RF electrode 232.

Figure 8A:
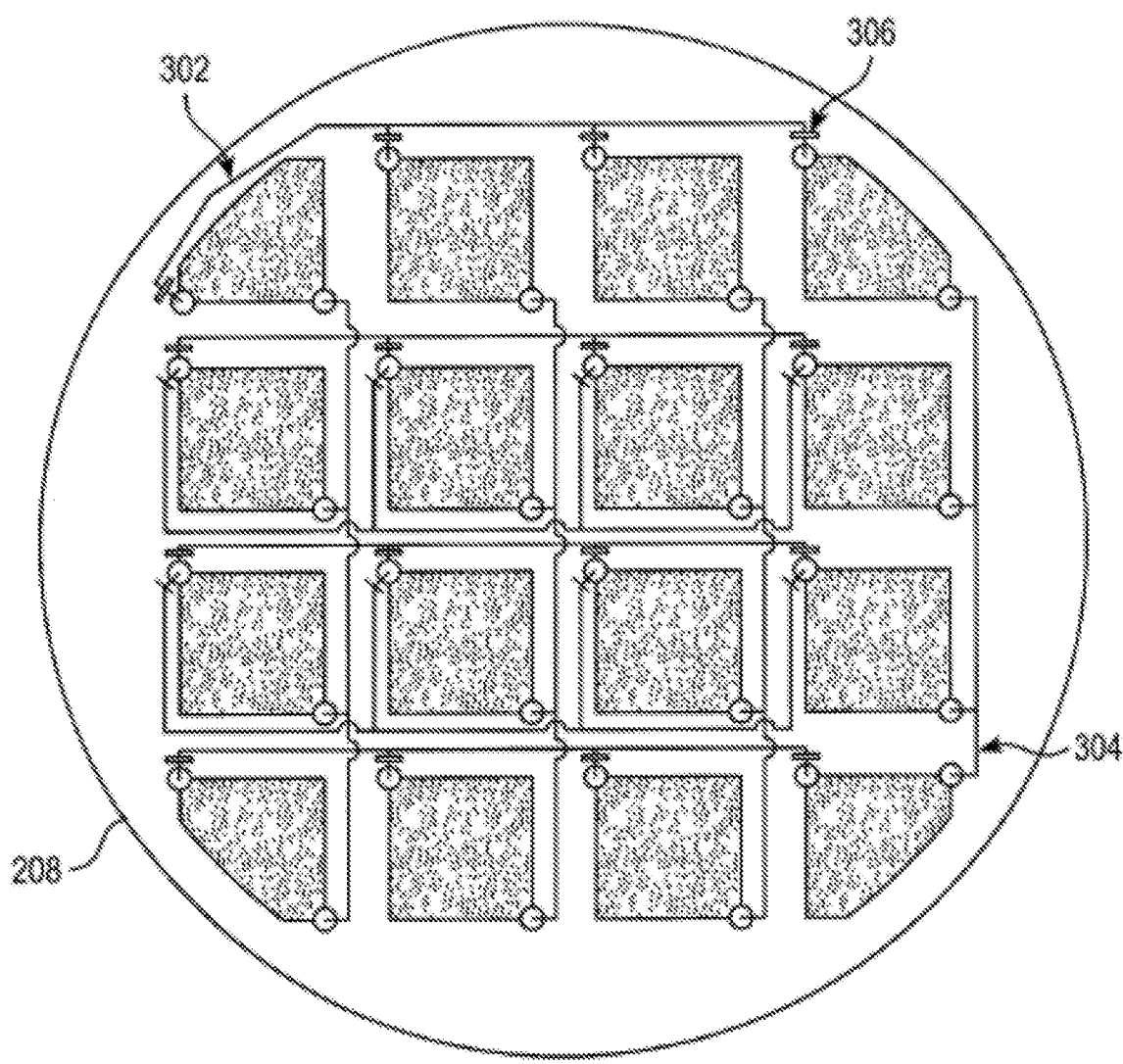
FIG. 8A illustrates an auxiliary heating layer of a substrate support assembly in accordance with an exemplary embodiment of the present disclosure.

FIG. 8A illustrates an auxiliary heating layer of a substrate support assembly in accordance with an exemplary embodiment of the present disclosure.

As shown in FIG. 8A, the ESC assembly 202 includes an array of thermal control elements 216 (e.g., heaters, local temperature elements) powered through a connection to two or more power supply lines 302 and two or more power return lines 304. Each power supply line is connected to at least two of the thermal control elements 216 and each power return line is connected to at least two of the thermal control elements 216. No two local thermal control elements 216 share the same pair of power supply 302 and power return 304 lines. By suitable electrical switching arrangements, it is possible to connect a pair of power supply 302 and power return 304 lines to a power supply (not shown), whereby only the thermal control elements 216 connected to this pair of lines are turned on. For example, each thermal control element 216 defining a local heater zone can be addressable by the switching electronics board 226 to provide power to an associated thermal control element 216 at a specified timing. The time-averaged heating power of each thermal control element 216 can be individually tuned by time-domain multiplexing. In order to prevent crosstalk between different thermal control elements 216, a diode 306 can be serially connected between each thermal control element 216 and the power supply line 302, or between each thermal control element 216 and the power return line 304.

In an exemplary embodiment, the primary heating plate 206 can include a central heater and three concentric heaters surrounding the central heater. The auxiliary heating layer 208 can include an array of film resistance heaters each of which is about the same size or smaller than a single device die or group of device dies on the substrate. As a result, at location above each thermal control element 216, the substrate temperature, and consequently the plasma etching process, can be controlled to maximize the yield of devices from the substrate. The scalable architecture of the auxiliary heating layer 208 can readily accommodate any number of local thermal control elements 216, (e.g., heaters or peltier devices) as specified for die-by-die substrate temperature control. For example, in an exemplary embodiment, ranges of 16 to 25, 26-46 to 49, 50 to 99 or more than 100 local temperature elements can be disposed across a substrate of 300-mm or larger diameter. A detailed description of an ESC assembly for a substrate support assembly in a semiconductor processing apparatus with multiple independently controllable planar thermal control elements is disclosed in commonly-owned U.S. Published Patent Publication Nos. 2011/0092072 and 2011/0143462 the disclosures of which are hereby incorporated by reference.

FIG. 8B illustrates a schematic overview of a timing circuit for controlling the thermal control elements in accordance with an exemplary embodiment of the present disclosure.

The power switching circuit 221 is configured to control and power each thermal control element 216 in the auxiliary heating layer 208 to generate a desired temperature profile. For simplicity, only four thermal control elements 216 are shown. It should be understood that the thermal array could include any number of thermal control elements suitable for obtaining the desired surface temperature profile of the ESC assembly 202.

The power switching circuit 221 includes switching devices 310 connected to each of the power return lines 304, and switching devices 312 connected to each of the power supply lines 302. The switching devices 312 can connect each power supply line 302 to a power source (e.g., power supply) 314 or electrically isolate the power supply lines 302 from the power source 314. The switching device 310 can connect each power return line 304 to the electrical ground or electrically isolate the return line from ground or from the low voltage side of the power source 314. A processor 316 of the control circuit 223 (e.g. a micro controller unit, a computer, etc.) controls the switching devices 310 and 312. A thermal control element 216 is powered, for example, when and only when the power supply line 302 connected to the respective thermal control element 216 is connected to the high voltage side of the power source 314 and the power return line 304 connected to this thermal control element 216 is connected to the electrical ground or the low voltage side of the power source. To prevent crosstalk between each thermal control element 216, a diode 318 can be serially connected between each thermal control element 216 and the power supply lines 302 connected thereto, or between each thermal control element 216 and the power return lines 304 connected thereto. The switching devices can be transistors such as a metal oxide field effect transistor (MOSFET), a power switching FET, or any other suitable transistor switch as desired.

The power switching circuit 221 further includes one or more temperature sensors configured to monitor temperature of respective locations on the distribution or switching electronics board 226 and/or the temperature of board components. The locations of the temperature sensors and the locations of each thermal control element 216 may or may not coincide. The temperature of each thermal control element 216 can be obtained or estimated by actual measurements, calibration, or calculation based on a theoretical or empirical model. For example, the estimated measurement can be based on a calibrated estimate, predictive estimate, or modeled estimate.

To activate a respective thermal control element 216, the control circuit 223 calculates a duty cycle for each thermal control element 216 based on a setpoint temperature of the thermal control element 216. The setpoint temperature of each thermal control element 216 is determined by a desired temperature profile of the entire heating plate. In a time-domain multiplexing scheme, the control circuit 223 controls the timing of the switching circuit 221 to maintain a connection between one power supply line 302 at a time and the power supply 314 for a time duration T, during which the switching circuit 221 maintains a connection between the electrical ground or the low voltage terminal of the power source and each of the thermal control elements 216 connected to the one power supply line 302 for the time duration ii, where i indicates each of the thermal control elements 216. The ii for each of the thermal control elements 216 may not necessarily be the same value because each heater zone may have a different temperature setpoint and therefore require a different power duty cycle. If the power supply 314 outputs a constant DC voltage V0 and all the thermal control elements 216 have a same electrical resistance R0, and the array has N power supply lines 302 then the average heating power of a thermal control element 216 is proportional to the ratio. The control circuit 223 starts the time duration ii for each thermal control element 216 at the beginning of the time duration T, which however leads to a peak in the total current carried by the one power supply line 302 at the beginning of the time duration T. Advantageously, in a time-domain multiplexing scheme according to an embodiment, the controller can temporally spread the beginnings of the time durations ii across the time duration T, i.e. not starting all the time durations ii at the same time, so as to decrease the maximum total current the one power supply line 302 carries throughout the time duration T.

Figure 9:
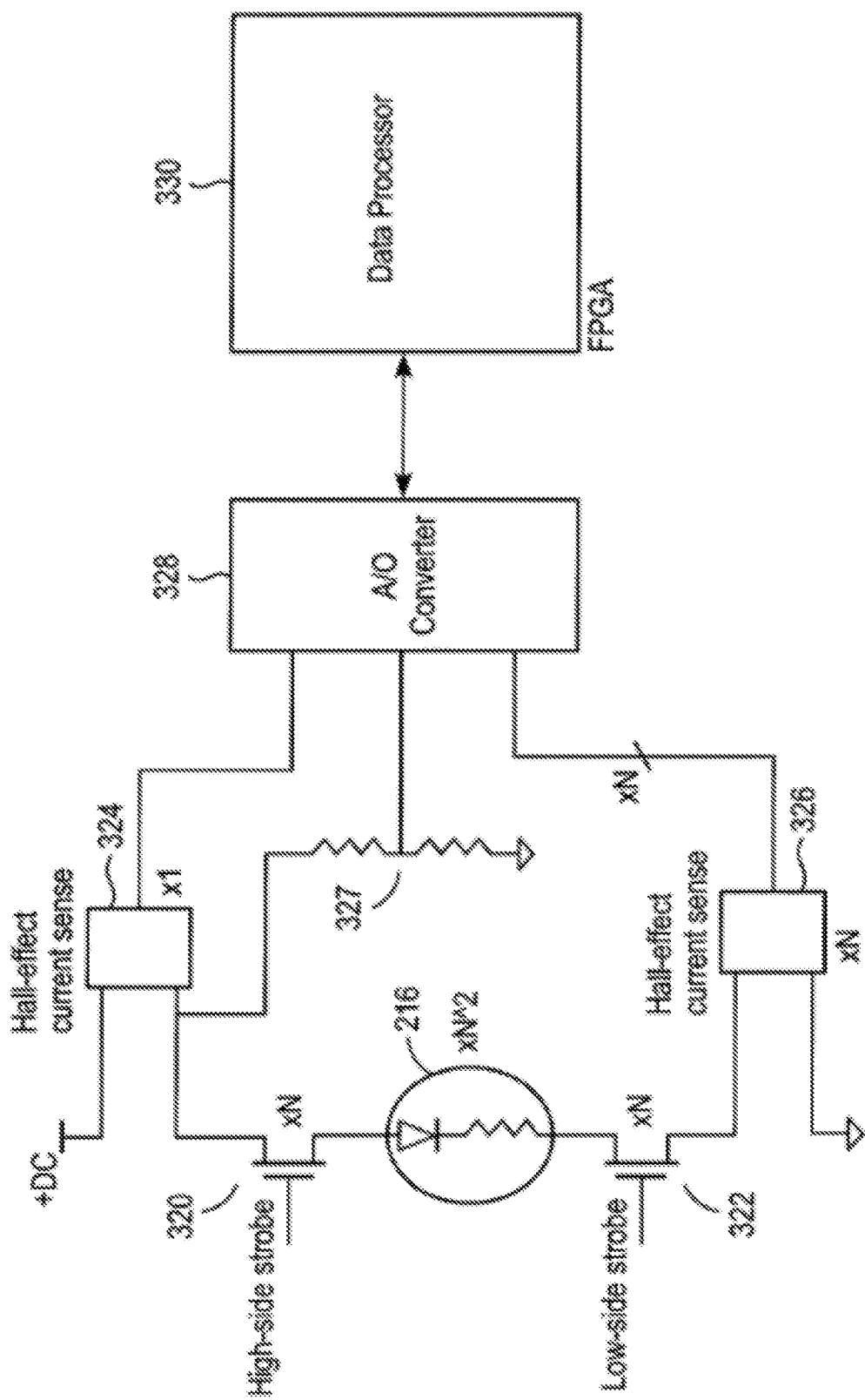
FIG. 9 illustrates a circuit diagram of a control circuit for controlling and monitoring the thermal control elements in accordance with an exemplary embodiment.

FIG. 9 illustrates a circuit diagram of a control circuit for controlling and monitoring the temperature control elements in accordance with an exemplary embodiment. As shown in FIG. 9, each thermal control element 216 is connected between high-voltage side and low-voltage side transistors 320, 322. The high-voltage side transistor 320 has its drain connected to a current sensor 324, such as a Hall Effect current sensor, which is also connected to DC power. The low-voltage side transistor 322 has a drain connected to the thermal control element 216 and its source connected to a current sensor 326, such as a Hall-effect current sensor, which is also connected to ground. When the temperature control element is addressed by the control circuit 223, the gates of the high-voltage and low-voltage side transistors are strobed to activate (e.g., heat/cool) the temperature control element. The output of each current sensor 324, 326 is provided to a voltage sampling/Analog-to-Digital (A/D) converter 328 on the switching electronics board 226. A voltage divider circuit 327 connected to the drain of the high-side transistor 320 also provides an output to the A/D converter 328. The output of the A/D converter 328 is provided to the processor 316, such as a programmable logic device, field programmable gate array (FPGA), or other suitable processing device as desired. The processor 316 processes the received data to determine the instantaneous current flowing through each heating zone 216, the instantaneous total current on the DC supply, and the voltage on the DC supply. These values can be stored in processor memory, memory on the switching electronics board 226, or the distribution board 228.

Figure 10:
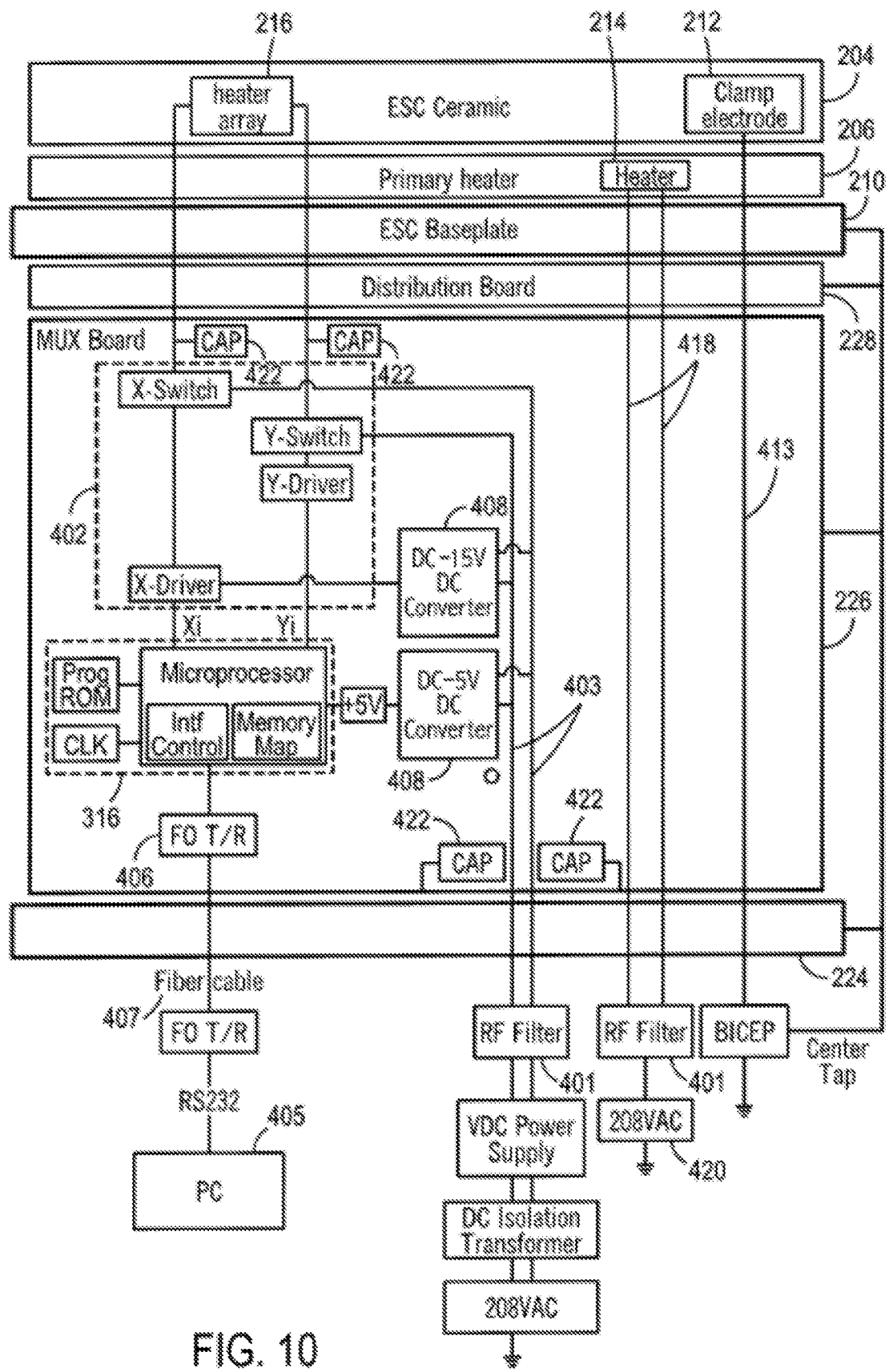
FIG. 10 illustrates a schematic diagram of control electronics of a switching electronics board in accordance with an exemplary embodiment of the present disclosure.

FIG. 10 illustrates a schematic diagram of control electronics of a power distribution assembly in accordance with an exemplary embodiment of the present disclosure. FIG. 9 illustrates an exemplary embodiment in which the switching and control circuits 222, 223 are disposed on a switching electronics board 226, which is connected to the distribution circuit disposed on a distribution board 228. It should be understood that in another exemplary embodiment the switching, control, and power distribution circuits 222, 223, 219, could be disposed on the distribution board 228 such that power distribution assembly includes only one circuit board in the enclosed volume 234 between the cooling plate 210 and the facilities plate 224.

As shown in FIG. 10, the switching electronics board 226 is arranged to receive DC power and provide the power selectively to each element of the array of thermal control elements 216 as needed to control the temperature at the surface 201 of the ESC ceramic layer 204. In an exemplary embodiment, the switching electronics board 226 can include a connection for receiving power from a DC power supply via an RF filter 401 via two power lines 403 (e.g., supply and return lines), the supplied DC power being rated at the operating voltage of the thermal control elements 216 of the ESC ceramic layer 204. The switching electronics board 226 also includes a power switching device 402, such as a power transistor, such as a metal-oxide semiconductor field effect transistor (MOSFET) or other suitable transistor as desired, connected to each of the power lines 403 for providing power to the array of thermal control elements 216. The switching electronics board 226 provides switched DC power to the ESC assembly 202 via the distribution board 228, the connections of which are described with respect to FIG. 2.

As discussed with respect to FIG. 8B, the processor 316 of the control circuit provides control signals to the switching devices 402 of the switching circuit so that each thermal control element 216, can be uniquely addressed to generate heat at the surface 201 of the ESC ceramic layer 204 as desired. The switching electronics board 226 conditions the DC power received from the DC power source via the RF filter over two power supply lines. DC power is supplied from the switching electronics board 226 to the thermal control elements 216 of the ESC ceramic layer 204 via the distribution board 228. The switching electronics board 226 is connected to receive the DC power such that the control electronics for the auxiliary heating layer 208 and/or the primary heating plate 206 are shielded in an enclosure inside the plasma processing chamber and connected on a high RF voltage side of the RF filter, one of the two power supply lines 403 having a positive potential and the other supply line having a negative or lower potential. Because the switching electronics board 226 receives only two input power lines for DC power, the number of connections specified for RF filtering is reduced, which in turn reduces the size, cost and complexity of the RF filtering for the power supply lines 403 from the switching electronics board 226 to the ESC ceramic layer 204.

The switching electronics board 226 can also include communication circuitry 406, such as an optical transmitter and receiver, for establishing data communication between the processor 316 and an external processor 405 (e.g., external communication device), such as a computer or other suitable control device as desired, over optical fiber 407. In another exemplary embodiment, the communication circuitry 406 can be configured to communicate over a wireless channel, such as, over selected RF frequencies. The communication circuitry 406 should be configured so that command and control signals communicated between the processor 316 of the switching electronics board 226 and the external processor 405 are isolated from active RF inside the plasma processing chamber. In another exemplary embodiment, this isolation can be achieved using isolation transformers, optocouplers, RF transceivers operating at a different frequency from the active RF in the plasma processing chamber, Wi-Fi transceivers, or any other suitable communication arrangement as desired. In still another exemplary embodiment, the communication circuitry 406 can be configured to communicate over a hard-wired communication channel. In a wired channel, additional filtering components can be used for RF, DC, and/or galvanic isolation such that the communication signals are isolated and immune to RF interference.

The switching electronics board 226 can include logic for encrypting and decrypting control or status messages communicated with the external processor 405. The switching electronics board 226 includes DC-to-DC converters 408 for stepping down voltages received from the two power lines 403. Each of the DC-to-DC converters 408 providing stepped down voltages to the processor 316 and the switching devices 402, for example. Sensors 410 can be strategically mounted as desired on the switching electronics board 226 to detect board temperature and/or the temperature of specified board components. Each sensor 410 is connected to provide an output to the processor 316, which stores the received signals in memory. In an exemplary embodiment, the output of the sensors can be stored in memory on the switching electronics board 226 and/or the distribution board 228. Temperatures of components external to the switching electronics board 226, such as, the ESC ceramic layer 204 or the cooling plate 210, for example, can be monitored and recorded by sensors 412.

Via the connection with the distribution board 228, the switching electronics board 226 can include electrical components and circuits for passing DC or AC power from an external power source to circuitry in the ESC assembly 202. For example, in an exemplary embodiment, the switching electronics board 226 can be configured to include a conductive trace or supply line 414 to pass DC power from an external DC source 416 through the distribution board 228 to the electrostatic clamping electrode 212 embedded in the ESC ceramic layer 204. In another exemplary embodiment, the switching electronics board 226 can be configured to include a conductive trace or supply line 418 to pass AC-power from an external AC source 420 through the distribution board 228 to the primary heaters 214 disposed in the primary heating plate 206 of the ESC assembly 202.

As already discussed, to shunt RF current from the auxiliary heaters (e.g., temperature control elements) 216 of the ESC assembly 202 away from the switching electronics board circuit and instead through the metal, or metal coated, facilities plate 224, capacitors 422 can be provided on the power input and output lines of the switching electronics board 226 in which one end of each capacitor 422 is connected to one of the power lines 403 and the other end of each capacitor 422 is connected to the facilities plate 224 or a common voltage plane (e.g. common conductive plane) on the PCB, which is connected to the facilities plate such that the common voltage plane and the facilities plate are at the same electrical potential. The use of capacitors 422 on the switching electronics board 226 in this manner reduces the risk that RF voltage on the switching electronics board 226 interferes with the operation of the electronic circuitry (switching devices 402, processor 316, power converters 408, or other suitable component as desired) also located thereon.

In an exemplary embodiment, the switching electronics board 226 can include voltage and/or current sensors 423 for monitoring voltages/currents on incoming data lines and bus circuits (see FIG. 9). The processor 316 can be configured to modify current or voltage outputs on the bus circuits based on changes in resistance or changes in an output of any of sensors 410, 412, or 423 as desired.

In another exemplary embodiment mentioned above, the processor 316 can be configured to perform real-time encryption and decryption of data communicated to an external device or processor. For example, data including control or status messages and data logging can be encrypted and/or decrypted during communication with an external device or processor. The processor can also include non-volatile resident or external memory for storing calibration data associated with the primary heaters 214 and the array of thermal control elements 216 of the ESC assembly 202. The processor 316 can be configured to receive software updates or be reprogrammed from an external device or processor via the communication circuitry 406. In another exemplary embodiment, the data stored in memory can be password protected to prevent unauthorized access to the processor and its content.

Figure 11:
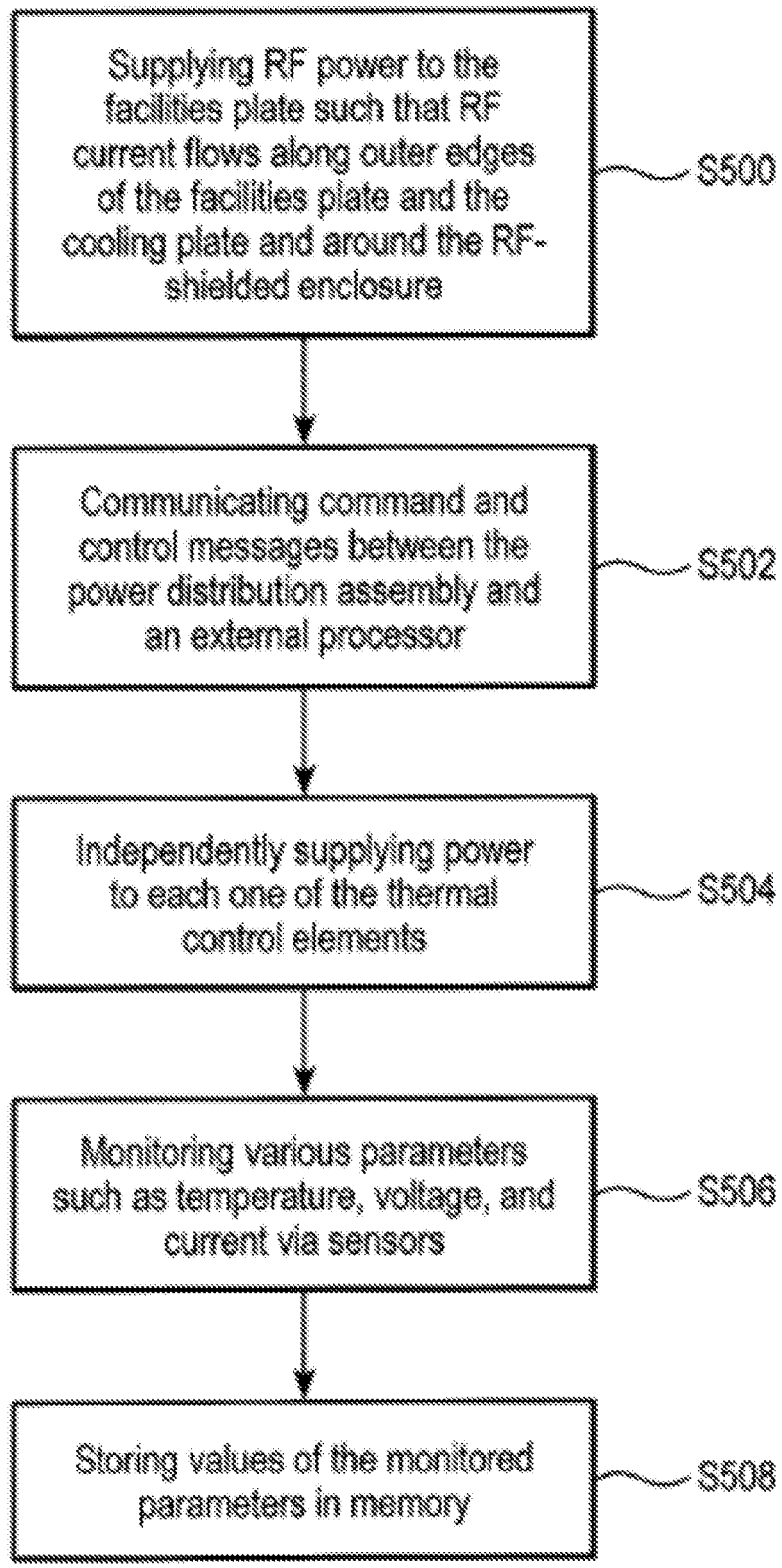
FIG. 11 is a flow diagram of a method of etching a plasma wager in a plasma processing chamber in accordance with an exemplary embodiment of the present disclosure.

FIG. 11 is a flow diagram of a method of etching a wafer in a plasma processing chamber in accordance with an exemplary embodiment of the present disclosure.

As already discussed through preceding FIGS. 1-10, the plasma processing chamber 102 includes an electrostatic chuck assembly 202 for supporting a substrate during plasma processing. The electrostatic chuck assembly 202 includes a cooling plate 210 and an array of temperature control elements 216 (e.g., heater array) operable to tune a spatial temperature profile on the semiconductor substrate. The temperature control elements 216 are powered by two or more power supply lines 302 and two or more power return lines 304 wherein each power supply line 302 is connected to at least two of the heaters 216 and each power return line 304 is connected to at least two of the heaters 216. The electrostatic chuck assembly 202 is mated to a power distribution assembly 211 via the cooling plate 210. The power distribution assembly 211 includes a power distribution circuit 219 connected to each power supply line 302 and power return line 304 of the heater array and a power switching device 221 is connected to the power distribution circuit 219. As already discussed, the electrostatic chuck assembly 202 also includes a facilities plate 224. The power distribution assembly 211 is mounted to at least the cooling plate 210 within an RF-shielded enclosure between the cooling plate 210 and the facilities plate 224.

As shown in FIG. 11, during operation RF power is supplied to the electrostatic chuck assembly via the facilities plate 224 such that RF current flows along outer surfaces of the facilities plate and the cooling plate and around the RF-shielded enclosure (S500). When RF power is supplied to the electrostatic chuck assembly an RF potential of the power distribution circuit 219 matches an RF potential of the facilities plate 224 (S504). Command and control messages are communicated between the control circuit 223 of the power distribution assembly within the plasma processing chamber and a processor 405 external to the plasma processing chamber (S502). Based on the command and control messages, the switching circuit 222 can be commanded to independently supply power to each one of the thermal control elements via one of the power supply lines and one of the power return lines to provide time-averaged power to each of the thermal control elements by time-divisional multiplexing of the plurality of switches (S506). The power distribution assembly 211 monitors various parameters such as temperature, voltage, and current via sensors (S508), and stores values associated with monitored parameters in memory (S510).

Although the disclosure has been presented in reference to the attached figures and specification, the disclosure is by no means limited to those as the disclosure is subject to variations within the scope allowed for by the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A substrate support for supporting a substrate in a plasma processing chamber, comprising:
   a heater array comprising thermal control elements to control a temperature of the substrate, the thermal control elements configured to receive power via two or more power supply lines and two or more power return lines, wherein each power supply line is connected to at least two of the thermal control elements and each power return line is connected to at least two of the thermal control elements;
   a power distribution circuit mated to a baseplate of the substrate support, the power distribution circuit connected to each power supply line and power return line of the heater array, wherein the power distribution circuit is formed on a first circuit board having a conductive common plane that is attached to the baseplate and that is at an electrical potential of the baseplate;
   a power switching device connected to the power distribution circuit to independently supply power to each one of the thermal control elements via one of the power supply lines and one of the power return lines; and
   a capacitor connected between each power supply line and the baseplate and between each power return line and the baseplate to shunt RF between the baseplate and the heater array so that the baseplate and the heater array are at a same RF potential,
   wherein one end of each capacitor is connected to a power supply line or a power return line and another end of each capacitor is connected to the conductive common plane that is attached to the baseplate.

2. The substrate support of claim 1 further comprising a diode serially connected between each of the thermal control elements and the power supply lines or between each of the thermal control elements and the power return lines.

3. The substrate support of claim 1 wherein the power switching device calculates a duty cycle for each of the thermal control elements based on a setpoint temperature for each of the thermal control elements.

4. The substrate support of claim 1 wherein the power switching device provides time-averaged power to each of the thermal control elements by time division multiplexing of a plurality of switches.

5. The substrate support of claim 1 wherein the power switching device is formed on the first circuit board.

6. The substrate support of claim 1 comprising an RF filter configured to receive power from a source and provide conditioned power to the heater array via the power switching device and the power distribution circuit.

7. The substrate support of claim 1 further comprising a facilities plate attached to the baseplate of the substrate support such that at least the power distribution circuit is located in an electrostatically-shielded volume between the baseplate and the facilities plate.

8. The substrate support of claim 7 further comprising an electrically conductive gasket between outer peripheries of the baseplate and the facilities plate.

9. The substrate support of claim 7 wherein the electrostatically-shielded volume between the baseplate and the facilities plate is a first electrostatically-shielded volume, the substrate support further comprising:
   a metal cage attached to the facilities plate such that a second electrostatically-shielded volume is formed between the metal cage and the facilities plate.

10. The substrate support of claim 9 wherein the second electrostatically-shielded volume is below the first electrostatically-shielded volume.

11. The substrate support of claim 10 wherein the power switching device is formed on a second circuit board, the second circuit board is DC isolated from ground and having a conductive common plane that is floated from ground and electrically connected to the facilities plate.

12. The substrate support of claim 11 wherein the second circuit board is attached to a lower surface of the facilities plate, such that the second circuit board is within the second electrostatically-shielded volume between the metal cage and the facilities plate.

13. The substrate support of claim 7 wherein the power switching device is formed on a second circuit board, the second circuit board having a conductive common plane that is attached to the facilities plate and is at a DC potential of the facilities plate.

14. The substrate support of claim 13 wherein the second circuit board of the power switching device is attached to a first surface of the facilities plate and comprises a plurality of switches on at least one surface of the second circuit board, each of the switches extending between the first surface of the facilities plate and a second surface of the facilities plate, and wherein at a point of termination on the second surface of the facilities plate, the switches are sealed from RF with a sealing member.

15. The substrate support of claim 13 wherein each of the first and second circuit boards comprises plural signal wiring or traces and filtering elements connected between each trace and respective conductive common voltage planes.

16. The substrate support of claim 13 wherein the second circuit board is attached to an upper surface of the facilities plate and in a recess of the facilities plate such that the second circuit board is within the electrostatically-shielded volume between the baseplate and the facilities plate.

17. The substrate of claim 16 wherein the first circuit board is attached to a lower surface of the baseplate and in a recess of the baseplate.

18. The substrate of claim 17 wherein the recesses of the baseplate and the facilities plate establish an RF shielded volume such that when RF is applied to the facilities plate, RF current flows around the first and second circuit boards along outer surfaces of the facilities plate and the baseplate.

19. The substrate support of claim 1 wherein the power distribution circuit includes memory that stores at least one of configuration data, identification data, operating data of the power switching device.

20. The substrate support of claim 1 further comprising a communication module that provides wireless communication between the power switching device and a processor external to the plasma processing chamber, wherein the power switching device is configured to encrypt and decrypt data signals communicated with the external processor.

* * * * *